United States Patent
Nagai (10) Patent No.: US 6,560,760 B1
(45) Date of Patent: May 6, 2003

(54) AUTOMATIC CELL PLACEMENT METHOD

(75) Inventor: Takao Nagai, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 106 days.

(21) Appl. No.: 09/677,771

(22) Filed: Oct. 3, 2000

(30) Foreign Application Priority Data

Apr. 13, 2000 (JP) .................................. 2000-112349

(51) Int. Cl.$^7$ .............................................. G06F 17/50

(52) U.S. Cl. ..................... 716/9; 716/1; 716/8; 716/12; 716/13

(58) Field of Search ............................. 716/9, 8, 1, 12, 716/13

(56) References Cited

U.S. PATENT DOCUMENTS 5,923,091 A 7/1999 Nagai
6,074,430 A * 6/2000 Tsukiboshi ................... 716/17

OTHER PUBLICATIONS

Breuer, "Min–Cut Placement", Journal of Design Automation & Fault–Tolerant Computing, vol. 1, No. 4, pp. 343–362, Oct. 1977.

* cited by examiner

Primary Examiner—Vuthe Siek
Assistant Examiner—Brandon Bowers
(74) Attorney, Agent, or Firm—Burns, Doane, Swecker & Mathis, LLP

(57) ABSTRACT

A plurality of cells is divided into cells of first and second cell groups so as to maximize the number of intra-group signal wires. The cells of the first cell group are placed to minimize a total length of intra-group signal wires of the first cell group. The cells of the second cell group are placed according to position information and number information of the cells to minimize a total length of the inter-group signal wires in a semiconductor integrated circuit in which a first and second semiconductor chips are attached to each other to make the first cell group arranged on the first semiconductor chip face the second cell group arranged on the second semiconductor chip. Therefore, a total length of signal wires in the semiconductor integrated circuit can be efficiently shortened, and the adverse influence of signal delay caused by the signal wires can be considerably reduced.

11 Claims, 6 Drawing Sheets

AUTOMATIC CELL PLACEMENT METHOD

BACKGROUND OF THE INVENTION

1. Field of the Invention

The present invention relates to an automatic cell placement method in which cells to be arranged in a semiconductor integrated circuit are automatically placed so as to shorten a total length of signal wires connecting the cells with each other.

2. Description of Related Art

As the number of cells (or electronic circuits) arranged in a semiconductor integrated circuit is increased, the influence of signal delay caused in signal wires on the circuits becomes important. In cases where intervals of signal wires connecting the cells with each other become shorter than 0.25 gm, the signal delay caused in signal wires becomes longer than the signal delay caused in transistors. Because the signal delay caused in a signal wire is in proportion to a signal wire length squared, it is required to shorten lengths of signal wires for the purpose of decreasing the signal delay caused in the signal wires.

In a conventional automatic cell placement and route method used for the manufacturing of a semiconductor integrated circuit, Min-Cut Placement (Melvin A. Breuer, "Min-Cut Placement", Journal of Design Automation & Fault Tolerant Computing, Vol.1, No.4, pp.343–362, October 1977) is widely used in a cell placing process as a conventional automatic cell placement method.

In the Min-Cut Placement, a placement area of a plurality of cells, which are connected with each other through signal wires, is repeatedly divided into two parts along a cut line. In this case, each of the cells is placed in one of two divided placement areas to minimize the number of signal wires crossing the cut line. More precisely, in cases where two or more cells are placed in each of the two divided placement areas, each divided placement area is again divided into two parts along another cut line. In cases where two or more cells are placed in one of the two divided placement areas and only one cell is placed in the other divided placement area, only the divided placement area having two or more cells is again divided into two parts along another cut line. Also, in cases where only one cell is placed in each of the two divided placement areas, the division of each divided placement area is not performed any more. That is, the division of the divided placement area is repeated until the number of cells placed in the divided placement area reaches 1, and the placement area of the cells is finally divided into a plurality of minimum placement areas respectively having one cell.

Therefore, in the Min-Cut Placement, in cases where the number of signal wires connecting a plurality of particular cells with each other is large, the minimum placement areas of the particular cells are closely placed. In contrast, in cases where the number of signal wires connecting a plurality of particular cells with each other is small or zero, the minimum placement areas of the particular cells are placed far from each other. Accordingly, a total length of the signal wires can be shortened.

Figure 5A:
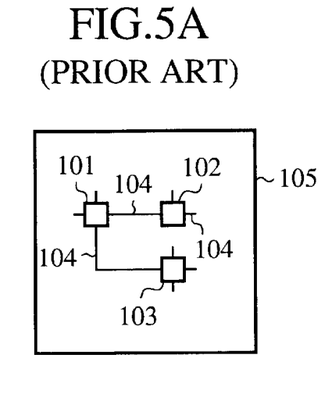
FIG. 5A shows a plurality of cells placed in a cell placement area.

FIG. 5A shows a plurality of cells placed in a cell placement area, and FIG. 5B to FIG. 5E show the cell placement areas respectively divided along one cut line or a plurality of cut lines according to the Min-Cut Placement. In FIG. 5A to FIG. 5E, 101 indicates a first cell, 102 indicates a second cell, 103 indicates a third cell, 104 indicates a signal wire connecting each pair of cells with each other, 105 indicates a cell placement area, 106 indicates a minimum cell placement area obtained by repeatedly dividing the cell placement area 105, C101 indicates a first cut line, C102 indicates a second cut line, C103 indicates a third cut line, C104 indicates a fourth cut line, C105 indicates a fifth cut line, and C106 indicates a sixth cut line.

Figure 5B:
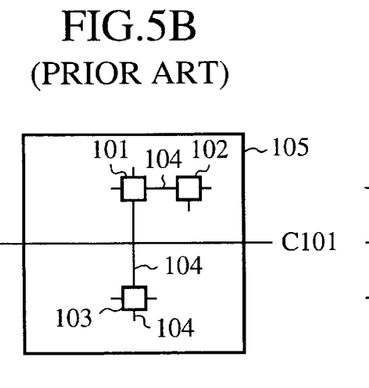
FIG. 5B shows the cell placement area of FIG. 5A divided along one cut line according to the Min-Cut Placement.
Figure 5C:
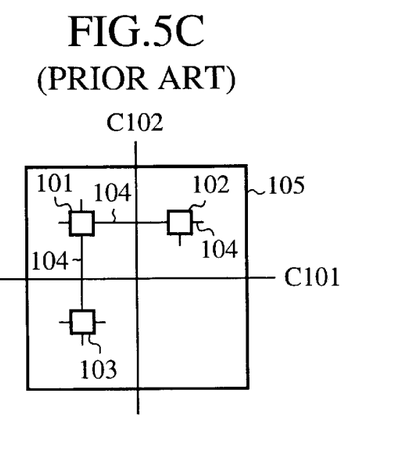
FIG. 5C shows the cell placement area of FIG. 5A divided along two cut lines according to the Min-Cut Placement.
Figure 5D:
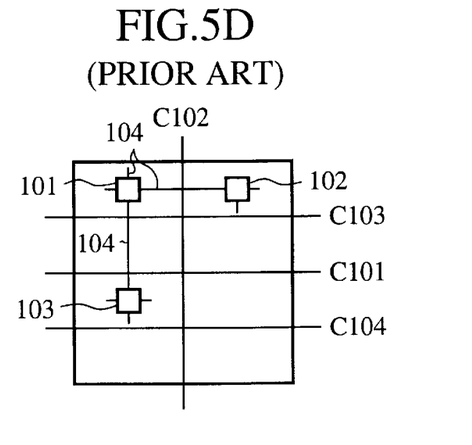
FIG. 5D shows the cell placement area of FIG. 5A divided along four cut lines according to the Min-Cut Placement.
Figure 5E:
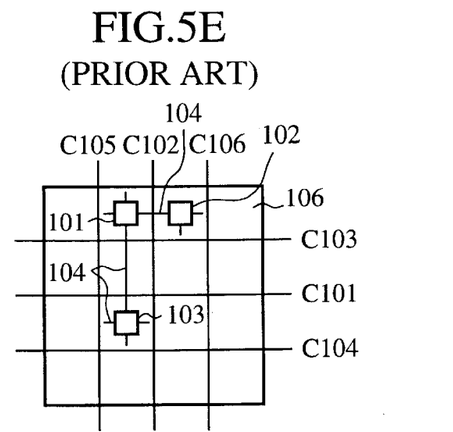
FIG. 5E shows the cell placement area of FIG. 5A divided along six cut lines according to the min-Cut Placement.

As shown in FIG. 5B, the cell placement area 105 shown in FIG. 5A is divided along the cut line C101, the cells 101 and 102 are placed in a divided cell placement area, and the cell 103 is placed in another divided cell placement area. As shown in FIG. 5C, each of the cell placement areas shown in FIG. 5B is divided along the cut line C102, and the cells 101, 102 and 103 are respectively placed in a divided cell placement area. As shown in FIG. 5D, each of two upper cell placement areas shown in FIG. 5C is divided along the cut line C103 into two parts to place cells (not shown) in each of divided upper cell placement areas, and each of two lower cell placement areas shown in FIG. 5C is divided along the cut line C104 into two parts to place cells (not shown) in each of divided lower cell placement areas. As shown in FIG. 5E, each of four left cell placement areas shown in FIG. 5D is divided along the cut line C105 into two parts to place a cell (not shown) in each of minimum left cell placement areas 106, and each of four right cell placement areas shown in FIG. 5D is divided along the cut line C106 into two parts to place a cell (not shown) in each of minimum right cell placement areas 106.

As is described above, in the Min-Cut Placement, because a placement area of a plurality of cells is repeatedly divided into two parts along a cut line to place only one cell in each divided placement area while minimizing the number of signal wires crossing the cut line every division, the Min-Cut Placement is useful for the manufacturing of a semiconductor integrated circuit in which a plurality of electronic circuits are arranged only on a single semiconductor chip.

However, as is disclosed in the U.S. Pat. No. 5,923,091, in cases where a semiconductor integrated circuit is manufactured by attaching two semiconductor chips to each other to make electronic circuits arranged on one semiconductor chip face electronic circuits arranged on the other semiconductor chip, because the group of electronic circuits of the semiconductor chips of the semiconductor integrated circuit is not arranged in one plane, there is a problem that the Min-Cut Placement is not appropriate for the manufacturing of the semiconductor integrated circuit in which electronic circuits arranged on one semiconductor chip face electronic circuits arranged on the other semiconductor chip. This type of semiconductor integrated circuit is described with reference to FIG. 6A to FIG. 6D.

Figure 6A:
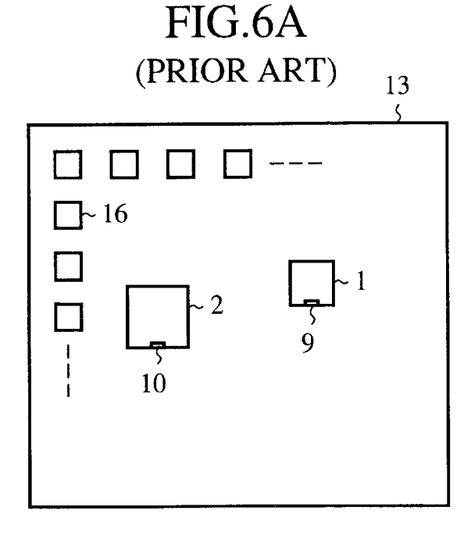
FIG. 6A is a plan view showing a plurality of cells arranged on a first semiconductor chip of a semiconductor integrated circuit disclosed in U.S. Pat. No. 5,923,091.
Figure 6B:
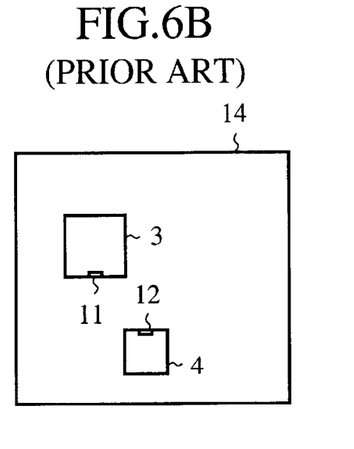
FIG. 6B is a plan view showing a plurality of cells arranged on a second semiconductor chip of the semiconductor integrated circuit.
Figure 6C:
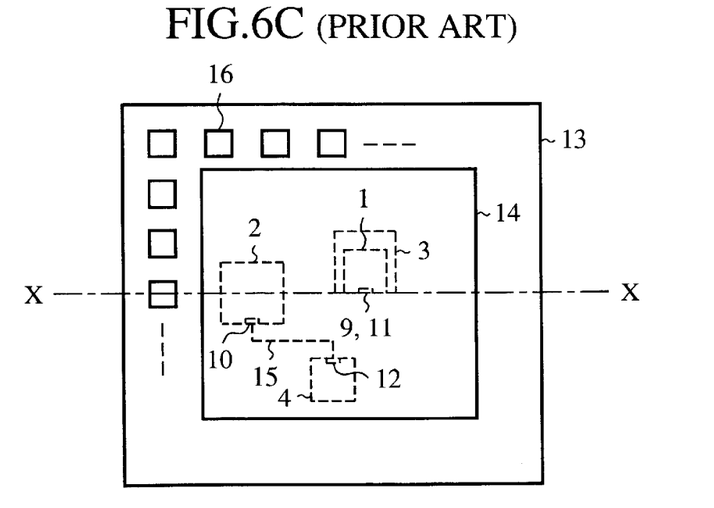
FIG. 6C is a plan view showing the semiconductor integrated circuit in which the first and second semiconductor chips shown in FIG. 6A and FIG. 6B are attached to each other so as to make the cells of the first semiconductor chip face the cells of the second semiconductor chip.
Figure 6D:
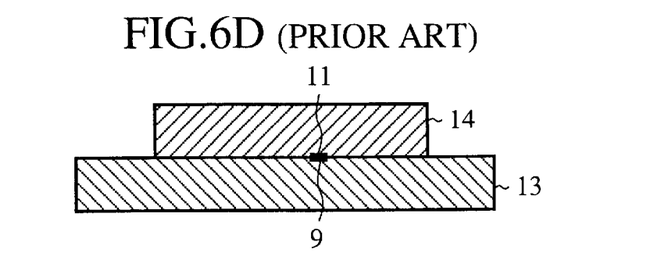
FIG. 6D is a cross sectional view taken substantially along line X—X of FIG. 6C.

FIG. 6A is a plan view showing a plurality of cells (or electronic circuits) arranged on a first semiconductor chip of a semiconductor integrated circuit, FIG. 6B is a plan view showing a plurality of cells (or electronic circuits) arranged on a second semiconductor chip of the semiconductor integrated circuit, FIG. 6C is a plan view showing the semiconductor integrated circuit in which the first and second semiconductor chips are attached to each other so as to make the cells of the first semiconductor chip face the cells of the second semiconductor chip, and FIG. 6D is a cross sectional view taken substantially along line X—X of FIG. 6C. In FIG. 6A to FIG. 6D, 13 indicates a first semiconductor chip, 14 indicates a second semiconductor chip, 1 indicates a first cell arranged on the first semiconductor chip 13, 2 indicates a second cell arranged on the first semiconductor chip 13, 3 indicates a third cell arranged on the second semiconductor chip 14, 4 indicates a fourth cell arranged on the second semiconductor chip 14, 9 indicates an input/output pin of the first cell 1, 10 indicates an input/output pin of the second cell 2, 11 indicates an input/output pin of the third cell 3, 12 indicates an input/output pin of the fourth cell 4, 15 indicates a signal wire connecting the input/output pin 10 of the second cell 2 and the input/output pin 12 of the fourth cell 4, and 16 indicates each of a plurality of bonding pads arranged in the peripheral area of the first semiconductor chip 13.

As shown in FIG. 6A to FIG. 6D, the first semiconductor chip 13, on which a first group of cells including the cells 1 and 2 is arranged, is formed, the second semiconductor chip 14, on which a second group of cells including the cells 3 and 4 is arranged, is formed, and the first semiconductor chip 13 and the second semiconductor chip 14 are attached to each other to make the first group of cells face the second group of cells. Therefore, the semiconductor integrated circuit disclosed in the U.S. Pat No. 5,923,091 is manufactured. Also, in this semiconductor integrated circuit, the input/output pin 9 of the first cell 1 is directly connected with the input/output pin 11 of the third cell 3 (refer to FIG. 6D), and the input/output pin 10 of the second cell 2 is connected with the input/output pin 12 of the fourth cell 4 through the signal wire 15. Therefore, no signal wire connecting the input/output pin 9 of the first cell 1 and the input/output pin 11 of the third cell 3 is required because the first cell 1 and the third cell 3 are arranged to make the first cell 1 face the third cell 3. Also, though the second cell 2 does not face the fourth cell 4, the signal wire 15 connecting the second cell 2 and the fourth cell 4 can be shortened as compared with a case where the first semiconductor chip 13 and the second semiconductor chip 14 are arranged not to make the group of cells of the first semiconductor chip 13 face the group of cells of the second semiconductor chip 14.

In general, to efficiently shorten a total length of signal wires in the semiconductor integrated circuit, it is preferred that a plurality of particular cells are preferentially arranged to face each other in cases where the number of signal wires connecting the particular cells with each other is large.

SUMMARY OF THE INVENTION

An object of the present invention is to provide, with due consideration to the drawbacks of the conventional automatic cell placement method, an automatic cell placement method in which cells to be arranged in a semiconductor integrated circuit, in which a first semiconductor chip and a second semiconductor chip are attached to each other to make a first cell group of the first semiconductor chip face a second cell group of the second semiconductor chip, are automatically placed so as to efficiently shorten a total length of signal wires used in the semiconductor integrated circuit.

The object is achieved by the provision of an automatic cell placement method comprising the steps of:

dividing a plurality of cells to be arranged in a semiconductor integrated circuit into cells of a first cell group and cells of a second cell group so as to maximize the number of inter-group signal wires respectively connecting one cell of the first cell group and one cell of the second cell group;

allocating the cells of the first cell group to a first semiconductor chip;

allocating the cells of the second cell group to a second semiconductor chip;

placing the cells of the first cell group in the first semiconductor chip, placing the cells of the second cell group in the second chip, and attaching the first semiconductor ship and the second semiconductor chip to each other to make the first cell group of the first semiconductor chip face the second cell group of the second semiconductor chip.

In the above steps, the cells to be arranged in the semiconductor integrated circuit are divided into the first cell group and the second cell group so as to maximize the number of inter-group signal wires.

Accordingly, in cases where the cells are placed to shorten, a total length of the inter-group signal wires, because the number of inter-group signal wires is maximized, a total length of signal wires used in the semiconductor integrated circuit can be efficiently shortened. Thus, the adverse influence of signal delay caused in the signal wires of the semiconductor integrated circuit can be considerably reduced. Therefore, the automatic cell placement method of the present invention is appropriate for the semiconductor integrated circuit in which the first semiconductor chip and the second semiconductor chip are attached to each other to make the cells of the first semiconductor chip face the cells of the second semiconductor chip.

It is preferred that the step of placing the cells comprises the steps of:

determining the placement of the cells of the first cell group;

preparing position information indicating positions of the cells of the first cell group of which the placement is determined;

preparing number information of the first cell group which indicates the number of inter-group signal wires connecting each of the cells of the first cell group and one or more corresponding cells of the second cell group;

preparing number information of the second cell group which indicates the number of intergroup signal wires connecting each of the cells of the second cell group and one or more corresponding cells of the first cell group; and determining the placement of the cells of the second cell group according to the position information, the number information of the first cell group and the number information of the second cell group.

In the above steps, because the placement of the cells of the second cell group is determined according to the position information of the cells of the first cell group and the number information of the first and second cell groups, the cells of the second cell group can be placed so as to shorten a total length of the inter-group signal wires. Therefore, a total length of signal wires used in the semiconductor integrated circuit can be efficiently shortened.

It is also preferred that the step of determining the placement of the cells of the second cell group includes the step of:

placing the cells of the second cell group so as to minimize a total length of the inter-group signal wires respectively connecting one cell of the first cell group and one cell of the second cell group.

Because each of the cells of the second cell group are placed so as to minimize a total length of the inter-group signal wires, a total length of signal wires used in the semiconductor integrated circuit can be efficiently shortened.

It is also preferred that the step of determining the placement of the cells of the second cell group comprises the step of:

placing one or more particular cells of the second cell group, which are to be connected with a particular cell of the first cell group, so as to be directly connected with the particular cell of the first cell group in the semiconductor integrated circuit; and placing the other particular cells of the second cell group, which are to be connected with the particular cell of the first cell group, so as to be arranged near the particular cell of the first cell group in the semiconductor integrated circuit.

In the above steps, because the particular cells of the second cell group are placed to be directly connected with the particular cell of the first cell group in the semiconductor integrated circuit, no inter-group signal wire connecting each particular cell of the second cell group and the particular cell of the first cell group is required. Also, because the other particular cells of the second cell group are placed to be arranged near the particular cell of the first cell group in the semiconductor integrated circuit, the inter-group signal wire connecting each of the other particular cells of the second cell group and the particular cell of the first cell group can be considerably shortened. Therefore, a total length of signal wires used in the semiconductor integrated circuit can be efficiently shortened.

It is also preferred that the step of determining the placement of the cells of the first cell group includes the step of:

placing the cells of the first cell group so as to minimize a total length of inner-group signal wires respectively connecting one pair of cells of the first cell group, and the step of determining the placement of the cells of the second cell group includes the step of:

placing the cells of the second cell group so as to minimize a total length of inner-group signal wires respectively connecting one pair of cells of the second cell group.

In the above steps, because the total length of the inner-group signal wires in the first and second cell groups is minimized, a total length of signal wires used in the semiconductor integrated circuit can be efficiently shortened.

The object is also achieved by the provision of an automatic cell placement method comprising the steps of:

dividing a plurality of cells to be arranged in a semiconductor integrated circuit into a plurality of cell blocks respectively having two cells or three cells to minimize the number of inter-block signal wires respectively connecting one cell of one cell block and one cell of another cell block;

allocating one of the two cells or one or two of the three cells existing in each cell block to a first semiconductor chip to form a first cell group of the first semiconductor chip;

allocating the other one cell of the two cells or the other one or the other two cells of the three cells existing in each cell block to a second semiconductor chip to form a second cell group of the second semiconductor chip;

placing the cells of the first cell group and the cells of the second cell group in the first semiconductor chip and the second semiconductor chip respectively, and attaching the first semiconductor chip and the second semiconductor chip to each other to make the first cell group of the first semiconductor chip face the second cell group of the second semiconductor chip.

In the above steps, the cells to be arranged in the semiconductor integrated circuit are divided into a plurality of cell blocks to minimize the number of interblock signal wires. One of the two cells or one or two of the three cells existing in each cell block is/are allocated to the first semiconductor chip. The other one cell of the two cells or the other one or the other two cells of the three cells existing in each cell block is/are allocated to the second semiconductor chip to form a second cell group. Because the number of inter-block signal wires is minimized, the number of intra-block signal wires connecting one of the two cells and the other cell in each cell block or connecting one or two of the three cells and the other one or the other two cells in each cell block can be maximized.

Accordingly, in cases where the cells of the first cell group and the cells of the second cell group are placed so as to shorten a total length of the inter-block signal wires, a total length of signal wires used in the semiconductor integrated circuit can be efficiently shortened. The adverse influence of signal delay cause in the signal wires of the semiconductor integrated circuit can be considerably reduced. Therefore, the automatic cell placement method of the present invention is appropriate for the semiconductor integrated circuit in which the first semiconductor chip and the second semiconductor chip are attached to each other to make the cells of the first semiconductor chip face the cells of the second semiconductor chip.

It is preferred that the step of placing the cells includes the step of determining the placement of the cells of the first cell group in the first semiconductor chip, and determining the placement of the cells of the second cell group in the second semiconductor chip.

It is also preferred that the step of determining the placement of the cells of the second cell group includes the step of:

placing the cells of the second cell group so as to minimize a total length of the inter-group signal wires respectively connecting one cell of the first cell group and one cell of the second cell group.

Because each of the cells of the second cell group are placed so as to minimize a total length of the inter-group signal wires, a total length of signal wires used in the semiconductor integrated circuit can be efficiently shortened.

It is also preferred that the step of determining the placement of the cells of the second cell group comprises the step of:

placing one or more particular cells of the second cell group, which are to be connected with a particular cell of the first cell group, so as to be directly connected with the particular cell of the first cell group in the semiconductor integrated circuit; and placing the other particular cells of the second cell group, which are to be connected with the particular cell of the first cell group, so as to be arranged near the particular cell of the first cell group in the semiconductor integrated circuit.

In the above steps, because the particular cells of the second cell group are placed to be directly connected with the particular cell of the first cell group in the semiconductor integrated circuit, no inter-group signal wire connecting each particular cell of the second cell group and the particular cell of the first cell group is required. Also, because the other particular cells of the second cell group are placed to be arranged near the particular cell of the first cell group in the semiconductor integrated circuit, the inter-group signal wire connecting each of the other particular cells of the second cell group and the particular cell, of the first cell group can be considerably shortened. Therefore, a total length of signal wires used in the semiconductor integrated circuit can be efficiently shortened.

It is also preferred that the step of determining the placement of the cells of the first cell group includes the step of:

placing the cells of the first cell group so as to minimize a total length of intra-group signal wires respectively connecting one pair of cells of the first cell group, and the step of determining the placement of the cells of the second cell group includes the step of:

placing the cells of the second cell group so as to minimize a total length of intra-group signal wires respectively connecting one pair of cells of the second cell group.

In the above steps, because the total length of the intra-group signal wires in the first and second cell groups is minimized, a total length of signal wires used in the semiconductor integrated circuit can be efficiently shortened.

It is also preferred that the step of dividing a plurality of cells includes the step of:

dividing three cells of one cell block into one cell and a set of two cells to maximize the number of signal wires respectively connecting the cell and the set of two cells in cases where the cell block has the three cells.

In the above step, in cases where the cell block has the three cells, because the one cell of the cell block is allocated to the first or second semiconductor chip and the set of two cells of the cell block is allocated to the other semiconductor chip, the number of inter-group signal wires respectively connecting one cell of the first cell group and one cell of the second cell group can be maximized. A total length of signal wires used in the semiconductor integrated circuit can be efficiently shortened by shortening the total length of the inter-group signal wires.

DETAILED DESCRIPTION OF THE PREFERRED EMBODIMENTS

The invention will now be described with reference to the accompanying drawings.

Embodiment 1

Figure 1:
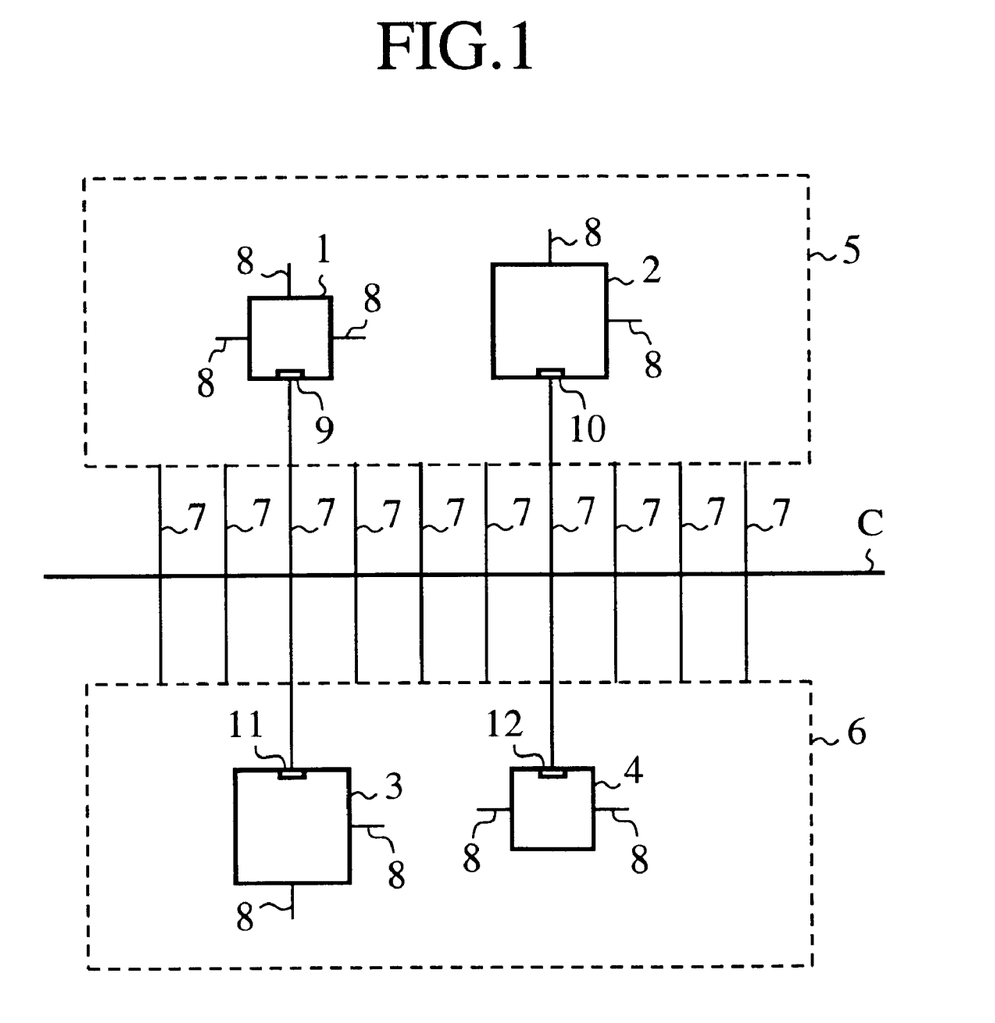
FIG. 1 shows cells of a first cell group and cells of a second cell group which are obtained by dividing the cells to be arranged in a semiconductor integrated circuit and are connected with each other through a plurality of signal wires.

FIG. 1 shows cells of a first cell group and cells of a second cell group which are obtained by dividing the cells to be arranged in a semiconductor integrated circuit and are connected with each other through a plurality of signal wires. In FIG. 1, 1 and 2 indicate cells, 5 indicates a first cell group including the cells 1 and 2, 3 and 4 indicate cells, 6 indicates a second cell group including the cells 3 and 4, 7 indicates each of a plurality of inter-group signal wires respectively connecting one cell of the first cell group 5 and one cell of the second cell group 6, 8 indicates each of a plurality of intra-group signal wires respectively connecting one pair of cells of the first cell group 5 or one pair of cells of the second cell group 6, 9 indicates an input/output pin of the cell 1, 10 indicates an input/output pin of the cell 2, 11 indicates an input/output pin of the cell 3, 12 indicates an input/output pin of the cell 4, and C indicates a cut line.

Figure 2:
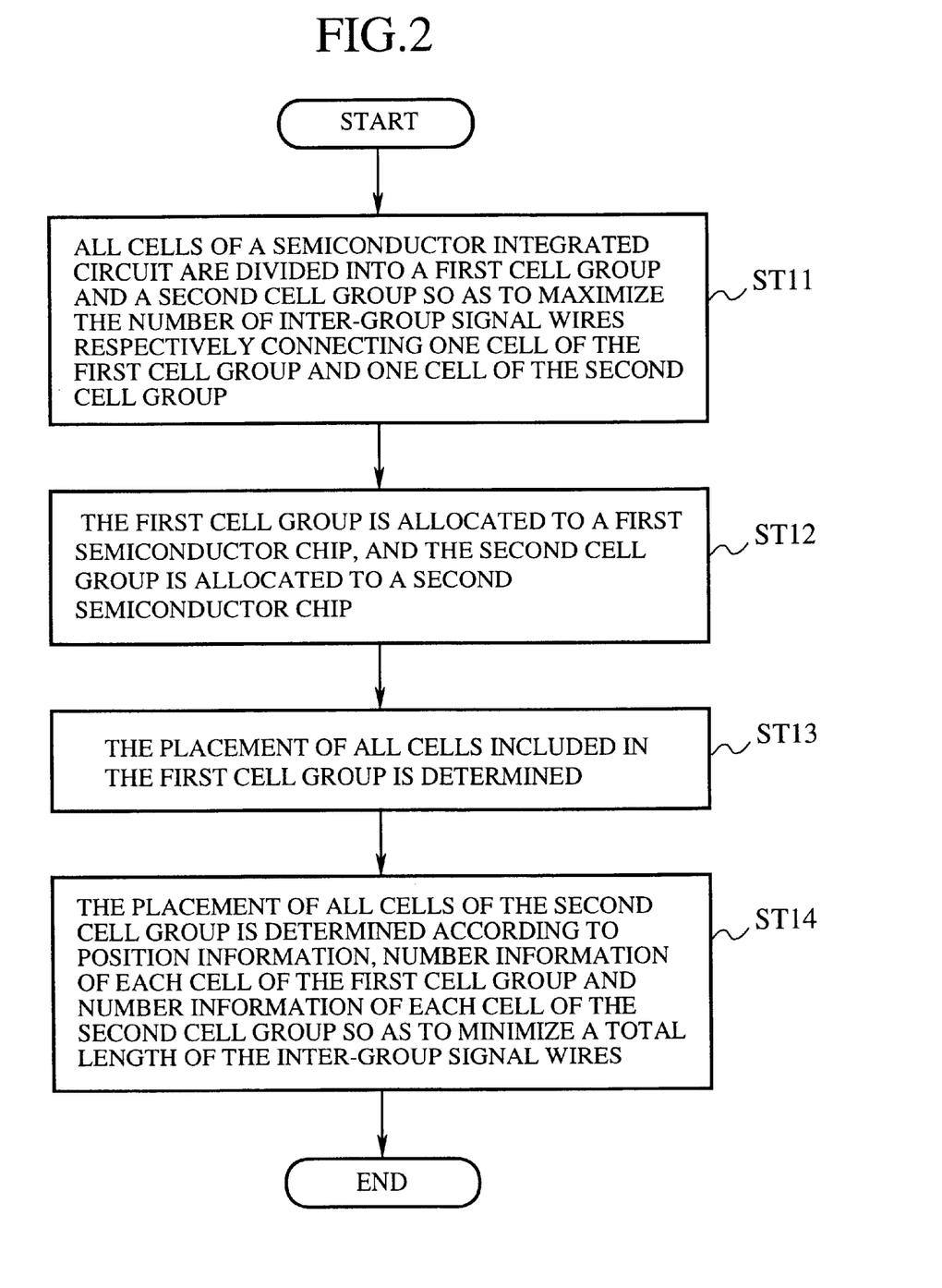
FIG. 2 is a flowchart showing an automatic cell placement method in a cell placement and route technique according to a first embodiment of the present invention.

FIG. 2 is a flowchart showing an automatic cell placement method in a cell placement and route technique according to a first embodiment of the present invention.

As shown in FIG. 2, in a step ST11, all cells to be arranged in a semiconductor integrated circuit are divided into a first cell group placed on one side of a cut line and a second cell group placed on the other side of the cut line. In this case, the division of the cells is performed on condition that the number of inter-group signal wires respectively connecting one cell of the first cell group and one cell of the second cell group is maximized (i.e. connection of cells to each other within a cell group are minimized). In the example shown in FIG. 1, all cells to be arranged in a semiconductor integrated circuit are divided into the first cell group 5 including the cells 1 and 2 and the second cell group 6 including the cells 3 and 4 so as to maximize the number of inter-group signal wires 7 (i.e. the probability of connected cells 1 and 2 to each other or cells 3 and 4 to each other is low).

Thereafter, in a step ST12, the first cell group is allocated to a first semiconductor chip, and the second cell group is allocated to a second semiconductor chip. That is, it is planned that the first semiconductor chip and the second semiconductor chip are attached to each other so as to make the first cell group allocated to the first semiconductor chip face the second cell group allocated to the second semiconductor chip.

Thereafter, in a step ST13, the placement of all cells included in the first cell group (that is, all cells of the first semiconductor chip) is determined according to the Min-Cut placement so as to minimize a total length of intra-group signal wires respectively connecting one pair of cells of the first cell group. In the example shown in FIG. 1, the placement of all cells included in the first cell group 5 is determined according to the Min-Cut placement so as to minimize a total length of all intra-group signal wires 8 respectively connecting one pair of cells of the first cell group 5.

In this embodiment, the Min-Cut placement is used. However, the first embodiment is not limited to the Min-Cut placement.

Thereafter, in a step ST14, position information, number information of each cell of the first cell group and number information of each cell of the second cell group (that is, each cell of the second semiconductor chip) are prepared. The position information indicates positions of the cells of the first cell group of which the placement is determined in the step ST13. The number information of each cell of the first cell group indicates the number of inter-group signal wires 7 through which the cell of the first cell group is connected with cells of the second cell group. The number information of each cell of the second cell group indicates the number of inter-group signal wires 7 through which the cell of the second cell group is connected with cells of the first cell group. In cases where N cells of the first cell group and M cells of the second cell group are to be arranged in the semiconductor integrated circuit, the number of pieces of number information is equal to N×M. Thereafter, the placement of all cells of the second cell group is determined according to the position information, the pieces of number information of the cells of the first cell group and the pieces of number information of the cells of the second cell group so as to minimize a total length of the inter-group signal wires 7. More precisely, the placement of the cells of the second cell group is performed as follows.

When there is a large number of particular inter-group signal wires 7, through which each of one or more particular cells of the first cell group is connected with a plurality of cells of the second cell group, one or more particular cells of the second cell group are placed so as to be directly connected with the particular cell of the first cell group in a semiconductor integrated circuit. The semiconductor integrated circuit has a first semiconductor chip and a second semiconductor chip attached to each other so as to make the cells arranged on the first semiconductor chip face the cells arranged on the second semiconductor chip. Each particular cell of the first cell group, and the other particular cells of the second cell group, which are connected with one particular cell of the first cell group, are placed to be arranged near the particular cell of the first cell group in the semiconductor integrated circuit for each particular cell of the first cell group. Also, it is preferred that all particular cells of the second cell group, which are connected with one particular cell of the first cell group,, are placed to be arranged near the particular cell of the first cell group in the semiconductor integrated circuit for each particular cell of the first cell group. In cases where one or more particular cells of the second cell group are placed to be directly connected with the particular cell of the first cell group in the semiconductor integrated circuit, no signal wire is required to connect each of the particular cells of the second cell group and the particular cell of the first cell group. Therefore, a total length of the inter-group signal wires 7, of which the number is maximized in the step ST11, can be minimized.

In the step ST14, the shortening of a total length of all intra-group signal wires 8 respectively connecting one pair of cells of the second cell group is not considered. However, it is applicable that a total length of all intra-group signal wires 8 corresponding to the second cell group be shortened on condition that the total length of the inter-group signal wires 7 is minimized.

Therefore, the number of intra-group signal wires becomes small, and the number of inter-group signal wires becomes large.

After the placement of the cells of the first cell group and the placement of the cells of the second cell group are completed, the cells of the first cell group are arranged on the first semiconductor chip according to the placement of the first cell group while electrically connecting each pair of cells of the first cell group through a real signal wire. The cells of the second cell group are arranged on the second semiconductor chip according to the placement of the second cell group while electrically connecting each pair of cells of the second cell group through a real signal wire. The first semiconductor chip and the second semiconductor chip are attached to each other to make the cells of the first semiconductor chip face the cells of the second semiconductor chip while electrically connecting cells of the first and second cell groups through real signal wires. Therefore, the semiconductor integrated circuit, which is composed of the cells of the first semiconductor chip and the cells of the second semiconductor chip, is manufactured.

As is described above, in the automatic cell replacement method according to the first embodiment, a plurality of cells to be arranged in a semiconductor integrated circuit are divided into cells of a first cell group and cells of a second cell group so as to maximize the number of inter-group signal wires respectively connecting one cell of the first cell group and one cell of the second cell group. The cells of the first cell group are allocated to a first semiconductor chip of a semiconductor integrated circuit. The cells of the second cell group are allocated to a second semiconductor chip of the semiconductor integrated circuit. The placement of the cells of the first cell group is performed according to the Min-Cut placement so as to shorten a total length of intra-group signal wires respectively connecting a pair of cells of the first cell group. Accordingly, in cases where the placement of the cells of the second cell group is performed on condition that a total length of the inter-group signal wires 7 is minimized in the semiconductor integrated circuit, in which the first semiconductor chip and the second semiconductor chip are attached to each other to make the cells of the first semiconductor chip face the cells of the second semiconductor chip, a total length of all signal wires connecting the cells arranged in the semiconductor integrated circuit can be efficiently shortened. Therefore, the adverse influence of the signal delay caused by the signal wires on the functions of the semiconductor integrated circuit can be considerably reduced.

Also, because each of one or more cells of the first semiconductor chip is placed to be directly connected with the corresponding cell of the second semiconductor chip in the semiconductor integrated circuit, the number of inter-group signal wires can be decreased. Therefore, a total length of all signal wires connecting the cells arranged in the semiconductor integrated circuit can be moreover shortened.

In the first embodiment, it is preferred that the direction of each cell is adjusted to shorten the length of a signal wire connected with the cell.

Embodiment 2

Figure 3:
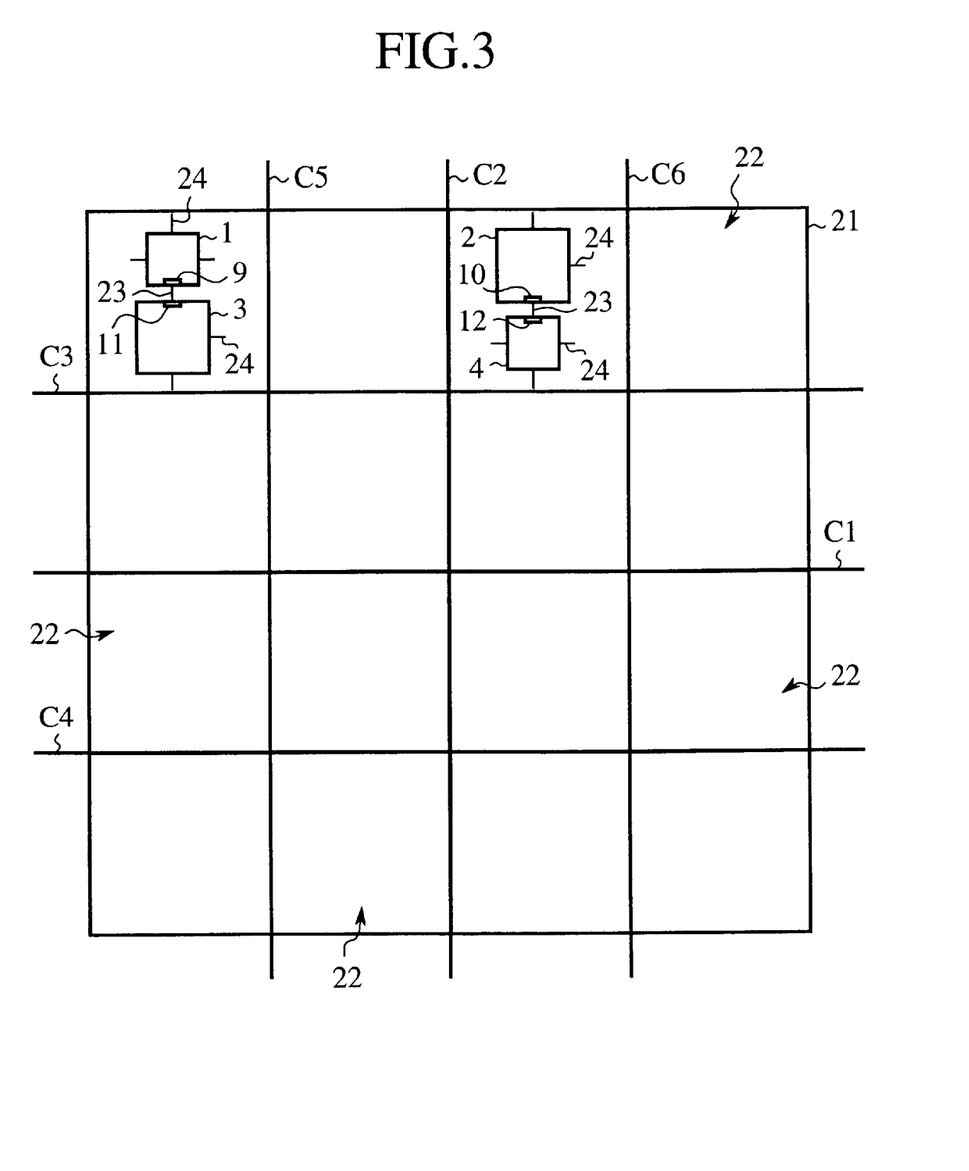
FIG. 3 shows a plurality of cells divided into a plurality of cell blocks, each of which has two cells, in a cell placement area according to an automatic cell placement method of a second embodiment of the present invention.

FIG. 3 shows a plurality of cells divided into a plurality of cell blocks, each of which has two cells, in a cell placement area according to an automatic cell placement method of a second embodiment of the present invention. In FIG. 3, 21 indicates a cell placement area, 22 indicates each of a plurality of divided cell placement areas obtained by dividing the cell placement area 21, 23 indicates each of a plurality of intra-group signal wires respectively connecting two cells of the same divided cell placement area 22, 24 indicates each of a plurality of inter-block signal wires respectively connecting one cell of one divided cell placement area 22 and one cell of another divided cell placement area 22, C1 to C6 respectively indicate a cut line which divides the cell placement area 21 into two parts. The other constitutional elements, which are indicated by the same reference numerals as those indicating the constitutional elements shown in FIG. 1, are the same as those shown in FIG. 1.

Figure 4:
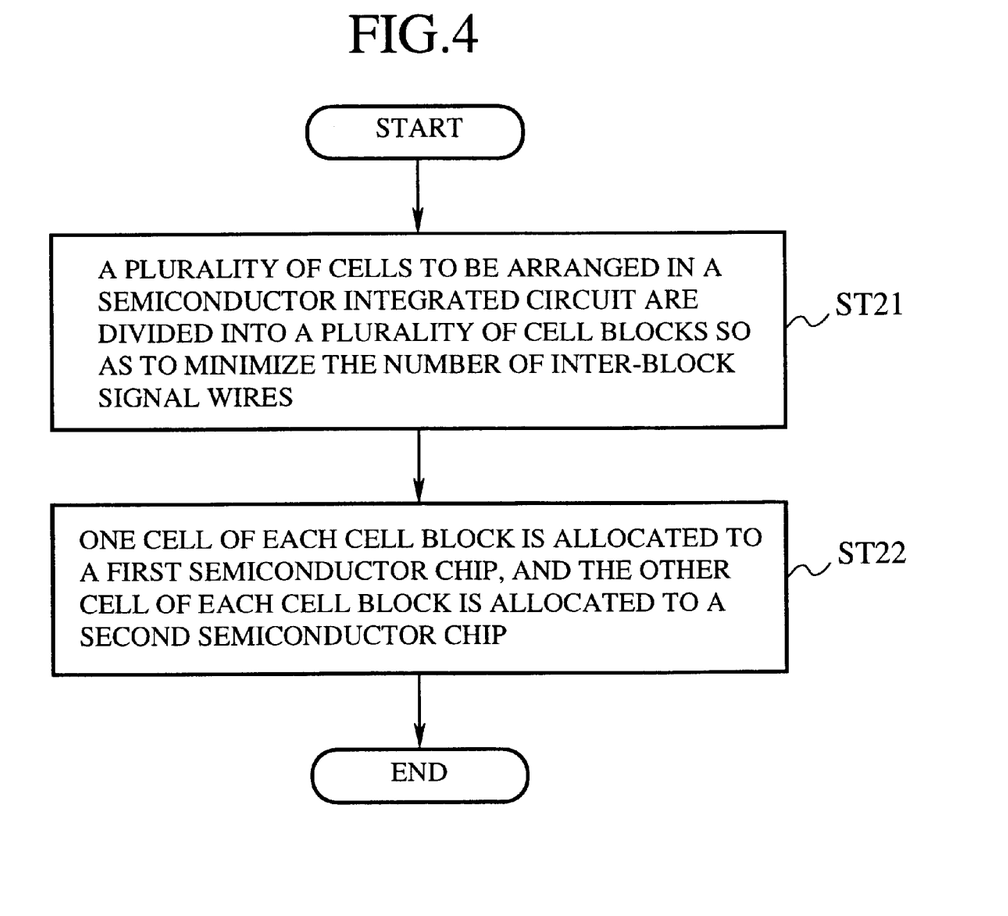
FIG. 4 is a flow chart showing an automatic cell placement method in a cell placement and route technique according to the first embodiment of the present invention.

FIG. 4 is a flow chart showing an automatic cell placement method in a cell placement and route technique according to the second embodiment of the present invention.

As shown in FIG. 4, in a step ST21, a plurality of cells to be arranged in a semiconductor integrated circuit are divided by the cut lines C1 to C6 into a plurality of cell blocks according to the Min-Cut placement. Each cell block has two cells. That is, the division of the cells of the cell placement area 21 according to the Min-Cut placement is repeatedly performed until the number of cells included in each cell block reaches 2. In the example shown in FIG. 3, the cells 1 and 3 are placed in one cell block, and the cells 2 and 4 are placed in another cell block.

Because the placement of the cells of the divided cell placement areas 22 is adjusted according to the Min-Cut placement, the cells of the cell placement area 21 are divided into the cell blocks so as to minimize the number of inter-block signal wires respectively crossing one of the cut lines C1 to C6. Therefore, each pair of cells, which are placed in the same cell block, is connected with each other at high probability.

Thereafter, in a step ST22, one cell of each cell block is allocated to a first semiconductor chip of the semiconductor integrated circuit, and the other cell of each cell block is allocated to a second semiconductor chip of the semiconductor integrated circuit. Therefore, a first cell group allocated to the first semiconductor chip and a second cell group allocated to the second semiconductor chip are determined. Here, it is planned that the first semiconductor chip and the second semiconductor chip are attached to each other so as to make the first cell group allocated to the first semiconductor chip face the second cell group allocated to the second semiconductor chip.

Here, in the step ST 21, the placement of the cells allocated to the first semiconductor chip is determined so as to minimize a total length of intra-group signal wires respectively connecting one pair of cells of the first cell group. Therefore, a step corresponding to the step ST13 of the first embodiment is not required in the second embodiment.

Also, after the cells of the cell placement area 21 are divided into N cell blocks in the step ST21, the placement of all cells of the second cell group is determined in the step ST 22 so as to minimize a total length of inter-group signal wires (including the signal lines 23 in the example shown in FIG. 3) respectively connecting one cell of the first cell group and one cell of the second cell group. More precisely, one cell of each cell block allocated to the second cell group is placed to be directly connected with the other cell of the same cell block allocated to the first cell group in the semiconductor integrated circuit, or one cell of each cell block allocated to the second cell group is placed to be arranged near the other cell of the same cell block allocated to the first cell group in the semiconductor integrated circuit. In cases where one cell of one cell block allocated to the second cell group are placed to be directly connected with the other cell of the same cell block allocated to the first cell group in the semiconductor integrated circuit, no signal wire is required to connect the cells of the same block. Therefore, a total length of the inter-group signal wires can be minimized. Therefore, a step corresponding to the step ST14 of the first embodiment is not required in the second embodiment.

In this embodiment, the Min-Cut placement is used. However, the second embodiment is not limited to the Min-Cut placement.

Also, in this embodiment, the shortening of a total length of all intra-group signal wires respectively connecting one pair of cells of the second cell group is not considered. However, it is applicable that a total length of all intra-group signal wires of the second cell group be shortened on condition that the total length of the inter-group signal wires is minimized.

Therefore, the number of intra-group signal wires becomes small, and the number of inter-group signal wires becomes large.

After the placement of the first cell group and the placement of the second cell group are completed, the cells of the first cell group are arranged on the first semiconductor chip according to the placement of the first cell group while electrically connecting each pair of cells of the first cell group through a real signal wire. The cells of the second cell group are arranged on the second semiconductor chip according to the placement of the second cell group while electrically connecting each pair of cells of the second cell group through a real signal wire. The first semiconductor chip and the second semiconductor chip are attached to each other to make the cells of the first semiconductor chip face the cells of the second semiconductor chip while electrically connecting cells of the first and second cell groups through real signal wires. Therefore, the semiconductor integrated circuit, which is composed of the cells of the first semiconductor chip and the cells of the second semiconductor chip, is manufactured.

In the second embodiment, the number of cells in each cell block is 2. However, it is applicable that each cell block have three cells by repeatedly performing the division of the cells of the cell placement area 21 according to the Min-Cut placement until the number of cells included in each cell block reaches 3 (step ST21). In this case, three cells of each cell block are divided into one cell and a set of two cells so as to maximize the number of signal wires through which the one cell is connected with the set of two cells, the one cell is allocated to the first semiconductor chip or the second semiconductor chip, and the set of two cells is allocated to the other semiconductor chip so as to make the number of cells allocated to the first semiconductor chip almost equal to the number of cells allocated to the second semiconductor chip (step ST22). In this case, a group of steps corresponding to the steps ST13 and ST14 of the first embodiment is not required in the same manner as in the case where each cell block has two cells.

Also, it is applicable that one or more cell blocks respectively have two cells and the other cell block or the other cell blocks have three cells.

As is described above, in the automatic cell replacement method according to the second embodiment, a plurality of cells to be arranged in a semiconductor integrated circuit are divided into a plurality of cell blocks respectively having two cells (or three cells) so as to minimize the number of signal wires respectively connecting one cell of one cell block and one cell of another block. One cell and the other cell (or the other two cells) of each cell block is/are allocated to one of first and second semiconductor chips. The other cell (or the other two cells) of the cell block is/are allocated to the different semiconductor chip. The cells allocated to the first semiconductor chip as a first cell group are placed according to the Min-Cut placement so as to shorten a total length of intra-group signal wires respectively connecting one pair of cells of the first cell group. Therefore, the number of inter-group signal wires respectively connecting one cell allocated to the first semiconductor chip and one cell allocated to the second semiconductor chip can be maximized. Accordingly, when the cells allocated to the second semiconductor chip as a second cell group are placed on condition that a total length of the inter-group signal wires is minimized in the semiconductor integrated circuit, in which the first semiconductor chip and the second semiconductor chip are attached to each other to make the cells of the first semiconductor chip face the cells of the second semiconductor chip, because the number of inter-group signal wires is maximized, a total length of all signal wires connecting the cells arranged in the semiconductor integrated circuit can be efficiently shortened. Therefore, the adverse influence of the signal delay caused by the signal wires on the functions of the semiconductor integrated circuit can be considerably reduced.

Also, because each of one or more cells of the first semiconductor chip is placed to be directly connected with the corresponding cell of the second semiconductor chip in the semiconductor integrated circuit, the number of inter-group signal wires can be decreased. Therefore, a total length of all signal wires connecting the cells arranged in the semiconductor integrated circuit can be moreover shortened.

In the second embodiment, it is preferred that the direction of each cell is adjusted to shorten the length of a signal wire connected with the cell.

What is claimed is:

1. An automatic cell placement method comprising the steps of:
    dividing a plurality of cells to be arranged in a semiconductor integrated circuit into cells of a first cell group and cells of a second cell group so as to maximize a number of inter-group signal wires respectively connecting cells of the first cell group and cells of the second cell group;
    allocating the cells of the first cell group to a first semiconductor chip;
    allocating the cells of the second cell group to a second semiconductor chip;
    placing the cells of the first cell group and the cells of the second cell group in the first semiconductor chip and the second semiconductor chip respectively; and
    attaching the first semiconductor chip and the second semiconductor chip to each other to make the first cell group of the first semiconductor chip face the second cell group of the second semiconductor chip.

2. An automatic cell placement method according to claim 1, wherein the step of placing the cells comprises the steps of:
    determining the placement of the cells of the first cell group;
    preparing position information indicating positions of the cells of the first cell group of which the placement is determined;
    preparing number information of the first cell group which indicates the number of inter-group signal wires connecting each of the cells of the first cell group and one or more corresponding cells of the second cell group;
    preparing number information of the second cell group which indicates the number of inter-group signal wires connecting each of the cells of the second cell group and one or more corresponding cells of the first cell group; and
    determining the placement of the cells of the second cell group according to the position information, the number information of the first cell group and the number information of the second cell group.

3. An automatic cell placement method according to claim 2, wherein the step of determining the placement of the cells of the second cell group includes the step of:
    placing the cells of the second cell group so as to minimize a total length of the inter-group signal wires respectively connecting one cell of the first cell group and one cell of the second cell group.

4. An automatic cell placement method according to claim 2, wherein the step of determining the placement of the cells of the second cell group comprises the step of:
    placing one or more particular cells of the second cell group, which are to be connected with a particular cell of the first cell group, to be directly connected with the particular cell of the first cell group in the semiconductor integrated circuit; and
    placing the other particular cells of the second cell group, which are to be connected with the particular cell of the first cell group, to be arranged near the particular cell of the first cell group in the semiconductor integrated circuit.

5. An automatic cell placement method according to claim 2, wherein the step of determining the placement of the cells of the first cell group includes the step of:
    placing the cells of the first cell group so as to minimize a total length of intra-group signal wires respectively connecting one pair of cells of the first cell group, and
    the step of determining the placement of the cells of the second cell group includes the step of:
        placing the cells of the second cell group so as to minimize a total length of intra-group signal wires respectively connecting one pair of cells of the second cell group.

6. An automatic cell placement method comprising the steps of:
    dividing a plurality of cells to be arranged in a semiconductor integrated circuit into a plurality of cell blocks respectively having two cells or three cells to minimize the number of inter-block signal wires respectively connecting one cell of one cell block and one cell of another cell block;
    allocating a) one of the two cells or b) one or two of the three cells existing in each cell block to a first semiconductor chip to form a first cell group of the first semiconductor chip;
    allocating a) the other one cell of the two cells or b) the other one or the other two cells of the three cells existing in each cell block to a second semiconductor chip to form a second cell group of the second semiconductor chip;
    placing the cells of the first cell group and the cells of the second cell group in the first semiconductor chip and the second semiconductor chip respectively; and
    attaching the first semiconductor chip and the second semiconductor chip to each other to make the first cell group of the first semiconductor chip face the second cell group of the second semiconductor chip.

7. An automatic cell placement method according to claim 6, wherein the step of placing the cells includes the steps of
    determining the placement of the cells of the first cell group in the first semiconductor chip; and
    determining the placement of the cells of the second cell group in the second semiconductor chip.

8. An automatic cell placement method according to claim 7, wherein the step of determining the placement of the cells of the second cell group includes the step of:
    placing the cells of the second cell group so as to minimize a total length of the inter-group signal wires respectively connecting one cell of the first cell group and one cell of the second cell group.

9. An automatic cell placement method according to claim 7, wherein the step of determining the placement of the cells of the second cell group comprises the steps of:

placing one or more particular cells of the second cell group, which are connected with a particular cell of the first cell group, to be directly connected with the particular cell of the first cell group in the semiconductor integrated circuit; and placing the other particular cells of the second cell group, which are connected with the particular cell of the first cell group, to be arranged near the particular cell of the first cell group in the semiconductor integrated circuit.

10. An automatic cell placement method according to claim 7, wherein the step of determining the placement of the cells of the first cell group includes the step of:

placing the cells of the first cell group so as to minimize a total length of intra-group signal wires respectively connecting one pair of cells of the first cell group, and the step of determining the placement of the cells of the second cell group includes the step of:

placing the cells of the second cell group so as to minimize a total length of intra-group signal wires respectively connecting one pair of cells of the second cell group.

11. An automatic cell placement method according to claim 6, wherein the step of dividing a plurality of cells includes the step of:

dividing three cells of one cell block into one cell and a set of two cells to maximize the number of signal wires respectively connecting the cell and the set of two cells in cases where the cell block has the three cells.

* * * * *